(12) United States Patent
Ueno et al.

(10) Patent No.: US 7,906,346 B2
(45) Date of Patent: Mar. 15, 2011

(54) METHOD FOR MANUFACTURING A MAGNETIC MEMORY DEVICE AND MAGNETIC MEMORY DEVICE

(75) Inventors: Shuichi Ueno, Tokyo (JP); Haruo Furuta, Tokyo (JP); Ryoji Matsuda, Tokyo (JP); Tatsuya Fukumura, Tokyo (JP); Shin Hasegawa, Tokyo (JP); Shinya Hirano, Tokyo (JP); Hiroyuki Chibahara, Tokyo (JP); Hiroshi Oshita, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 203 days.

(21) Appl. No.: 12/187,846

(22) Filed: Aug. 7, 2008

(65) Prior Publication Data

US 2009/0039451 A1    Feb. 12, 2009

(30) Foreign Application Priority Data

Aug. 7, 2007 (JP) .................................. 2007-205516

(51) Int. Cl.
*H01L 21/00* (2006.01)
(52) U.S. Cl. ...................... 438/3; 438/622; 257/E21.665
(58) Field of Classification Search ................ 438/3, 48, 438/622; 257/414, 421, 422, 427, E21.655, 257/E29.323
See application file for complete search history.

(56) References Cited

U.S. PATENT DOCUMENTS

2005/0070033 A1* 3/2005 Kajiyama .......................... 438/3
2006/0088947 A1* 4/2006 Lien et al. .......................... 438/3

FOREIGN PATENT DOCUMENTS

JP    2000-277612    10/2000

* cited by examiner

*Primary Examiner* — Michael S Lebentritt
*Assistant Examiner* — Daniel Whalen
(74) *Attorney, Agent, or Firm* — McDermott Will & Emery LLP

(57) ABSTRACT

A method for manufacturing a magnetic memory device which includes a TMR element, and the method includes: a step of forming a lower wiring layer; a step of forming an interlayer insulating layer on the lower wiring layer; a step of forming an opening in the interlayer insulating layer so that the lower wiring layer is exposed; a step of forming a barrier metal layer so that the interlayer insulating layer and an inner surface of the opening are covered; a step of forming a metal layer on the barrier metal layer so that the opening is embedded; a polishing step of removing the metal layer on the barrier metal layer through polishing using the barrier metal layer as a stopper so that a wiring layer that includes a metal layer being embedded in the opening and the barrier metal layer is formed; and an element fabricating step of fabricating a TMR element on the wiring layer.

5 Claims, 16 Drawing Sheets

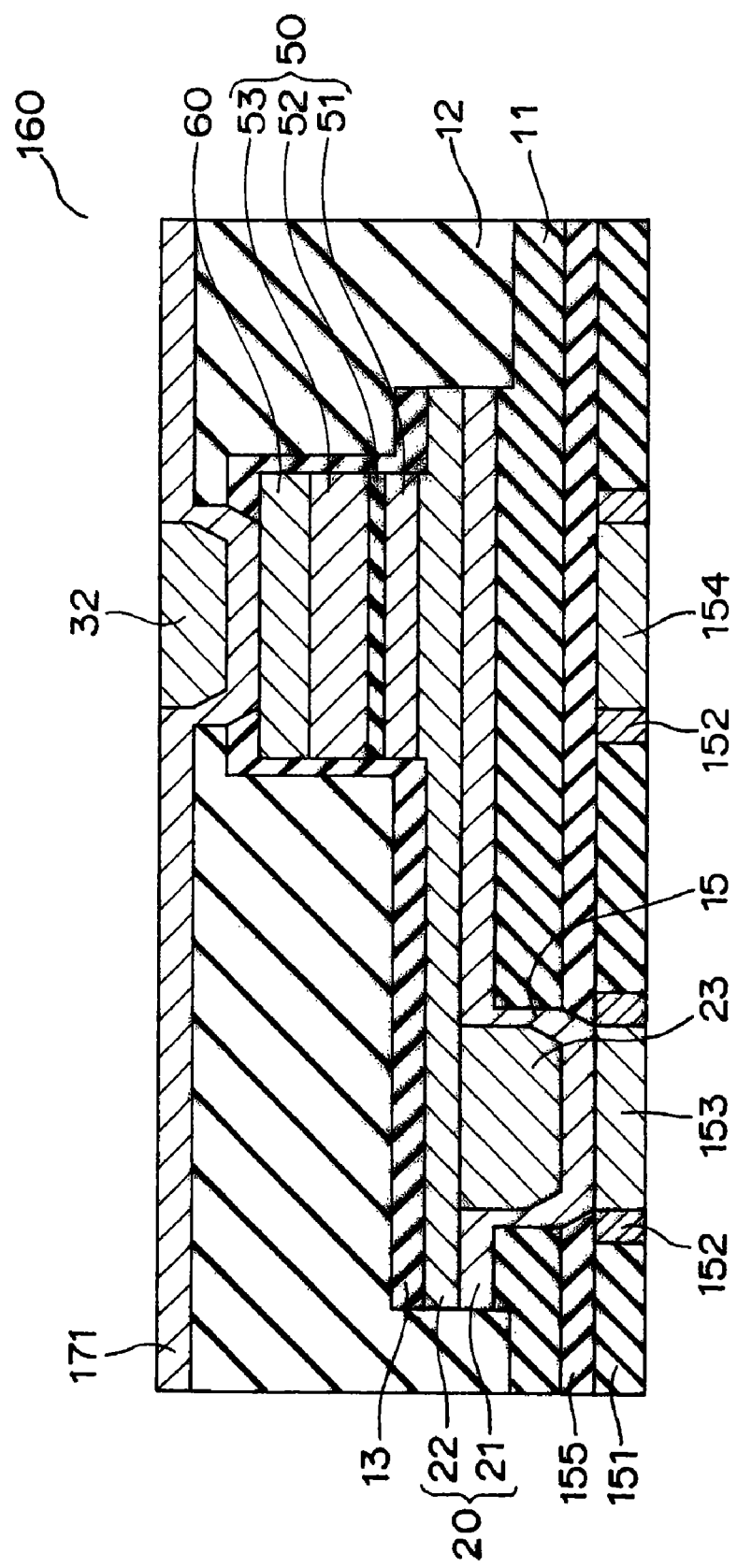

METHOD FOR MANUFACTURING A MAGNETIC MEMORY DEVICE AND MAGNETIC MEMORY DEVICE

CROSS-REFERENCE TO RELATED APPLICATION

The disclosure of Japanese Patent Application No. 2007-205516 filed on Aug. 7, 2007 including specification, drawings and claims is incorporated herein by reference in its entirely.

BACKGROUND OF THE INVENTION

1. Field of the Invention

The present invention relates to a method for manufacturing a magnetic memory device and a structure for the same, and in particular, to a method for manufacturing a non-volatile magnetic memory device where inconsistency in the properties of memory cells can be reduced and a structure for the same.

2. Description of the Related Art

A TMR (tunneling magneto-resistance) element is located between a digit line and a bit line in a MRAM having a conventional structure. The TMR element is formed on a wiring layer and made of an insulating layer, as well as a free layer and a pin layer, which are provided so as to sandwich the insulating layer. It is noted that the TMR element is in some cases referred to as an MTJ (magnetic tunneling junction) element.

In the MRAM, an opening is formed in an interlayer insulating film and a metal layer is formed on the opening in accordance with, for example, a sputtering method, and after that, the surface is flattened in accordance with a CMP method, so that a plug connected to a wiring layer for connecting the wire and the TMR element in the lower layer is formed. Furthermore, a free layer, an insulating layer and a pin layer are laminated on the wiring layer in this order (JP 2000-277612, A).

SUMMARY OF THE INVENTION

In the MRAM, there is inconsistency in the film thickness of the interlayer insulating film in the case where the surface of the plug connected to the wiring layer is flattened in accordance with a CMP method. As a result, there is inconsistency in the distance between the digit line and the free layer in each TMR element, and thus, a problem arises such that there is inconsistency of the current for writing into the TMR element.

In addition, in the case where there is microscopic roughness on the surface of the wiring layer, on top of which the TMR element is mounted, a problem arises such that there is slight inconsistency in the film thickness of the insulating layer (nail coupling) and is inconsistency of the current for writing into the TMR element.

In addition, the surface of the wiring layer tends to easily become uneven or rough, particularly in the periphery of an opening connecting to the wire in the lower layer. For this reason, it is necessary to make the distance between the opening and the TMR element increase in comparison with a case where there is no roughness, and thus, it is difficult to miniaturize the MRAM.

Furthermore, in the case where a wiring layer is formed in accordance with a sputtering method, the film thickness in the wiring layer becomes thin in the corner portion of the opening. As a result, oxygen enters into beneath lower portion of the opening through the corner portion, and thus, a plug beneath the opening corrodes and a problem arises such that the reliability lowers.

Therefore, an object of the present invention is to provide a method for manufacturing a magnetic memory device where the inconsistency of the current required for writing in the TMR element can be reduced, and which is highly reliable and can be miniaturized.

The present invention provides a method for manufacturing a magnetic memory device which includes a TMR element, and the method includes: a step of forming a lower wiring layer; a step of forming an interlayer insulating layer on the lower wiring layer; a step of forming an opening in the interlayer insulating layer so that the lower wiring layer is exposed; a step of forming a barrier metal layer so that the interlayer insulating layer and an inner surface of the opening are covered; a step of forming a metal layer on the barrier metal layer so that the opening is embedded; a polishing step of removing the metal layer on the barrier metal layer through polishing using the barrier metal layer as a stopper so that a wiring layer that includes a metal layer being embedded in the opening and the barrier metal layer is formed; and an element fabricating step of fabricating a TMR element on the wiring layer.

In addition, the present invention is a magnetic memory device including a TMR element, and the device includes: a lower wiring layer; an interlayer insulating layer provided on the lower wiring layer; an opening provided to the interlayer insulating layer so that the lower wiring layer is exposed; a wiring layer including a barrier metal layer which covers the interlayer insulating layer and an inner surface of the opening and a metal layer being embedded in the opening; and a TMR element which is provided on the wiring layer and includes a lower magnetic film, a tunnel insulating film and an upper magnetic film.

As described above, in a method for manufacturing a magnetic memory device according to the present invention, the inconsistency in the current required for writing in into the TMR element can be reduced, and it becomes possible to provide a magnetic memory device which is highly reliable and can be miniaturized.

In addition, in the magnetic memory device according to the present invention, the inconsistency in the current for writing into the TMR element can be reduced, and it becomes possible to provide a miniaturized magnetic memory device.

BRIEF DESCRIPTION OF THE DRAWINGS

FIG. 3 is a cross sectional view showing a memory cell according to the first embodiment;

DETAILED DESCRIPTION OF THE PREFERRED EMBODIMENTS

First Embodiment

Figure 1B:
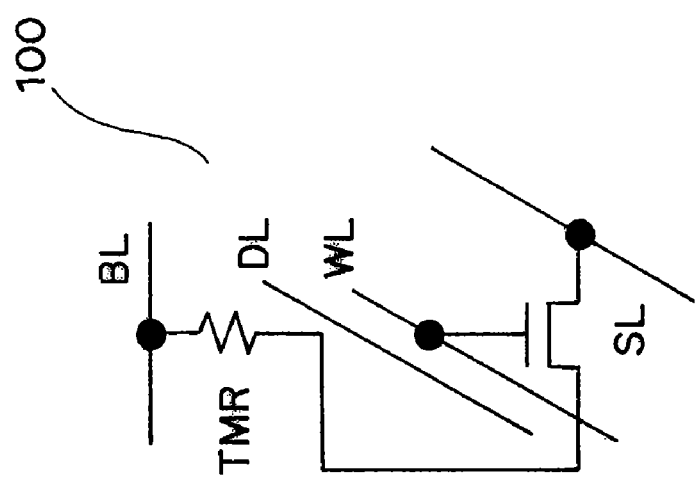
FIGS. 1A and 1B show an MRAM according to the first embodiment.
Figure 1A:
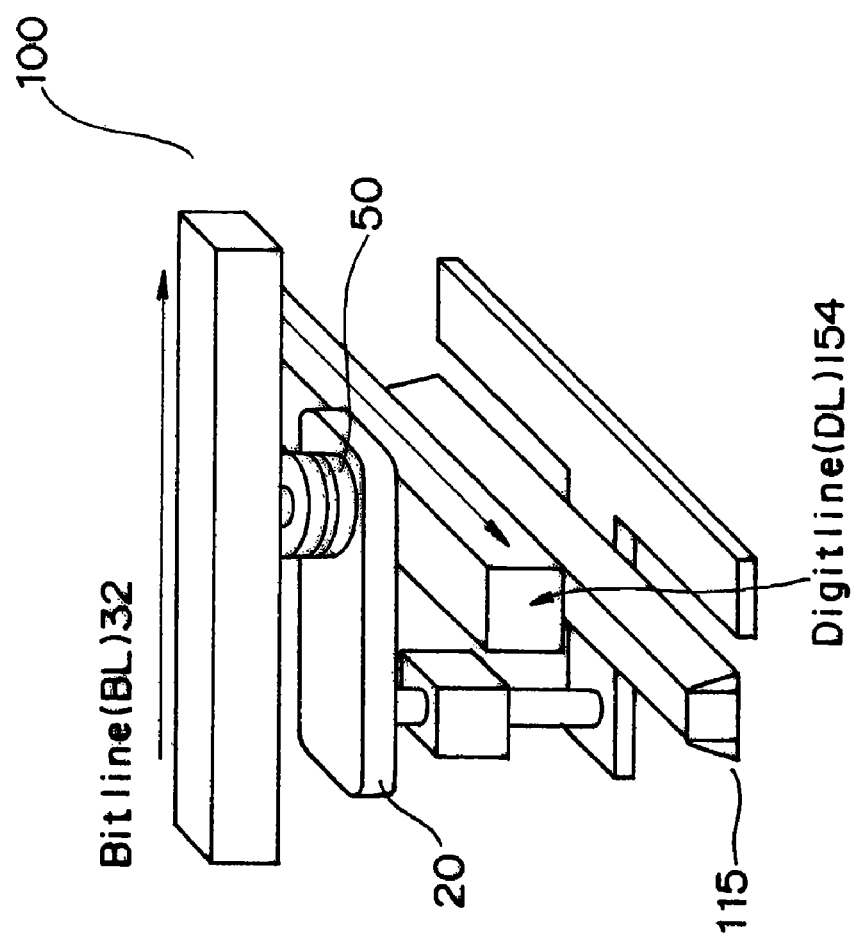

FIGS. 1A and 1B show a magnetic memory device according to the first embodiment, concretely, an MRAM. FIG. 1A is a perspective view showing an MRAM, denoted by 100 as a whole, and FIG. 1B is a circuit view thereof.

The MRAM 100 includes a TMR element 50. The TMR element 50 is formed on a wiring layer (lead-out electrode) 20 and electrically connected to the wiring layer 20. The wiring layer 20 is electrically connected to a transistor 115. A digit line 154 is provided beneath the TMR element 50.

In addition, the TMR element 50 is also connected to a bit line 32. The bit line 32 and the digit line 50 are arranged in a direction so as to intersect at approximately a right angle, and a synthetic magnetic field resulting from currents flowing through the bit line and the digit line changes the direction of the magnetic field in the free layer of the TMR element 50.

Figure 2:
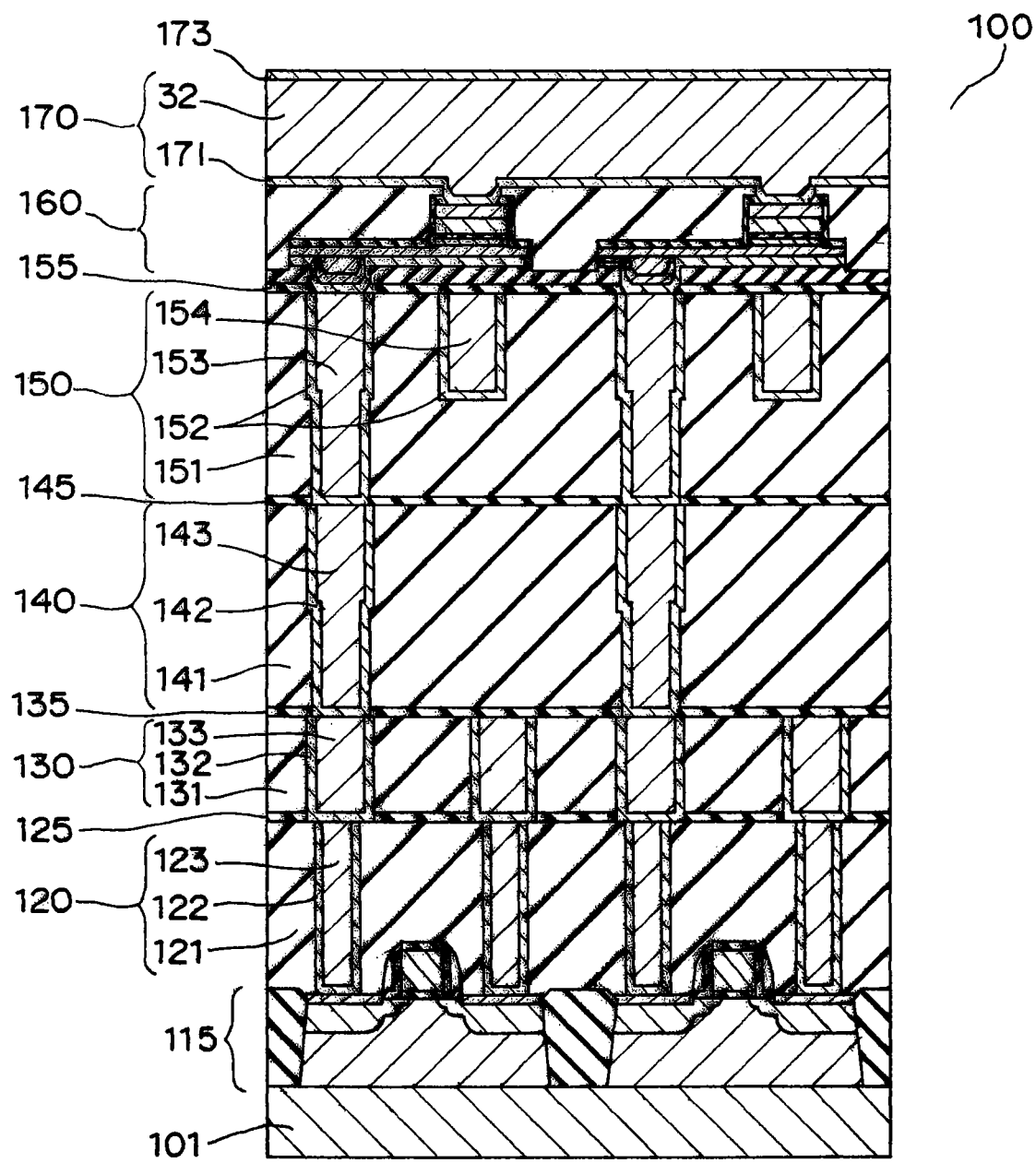
FIG. 2 is a cross sectional view showing the MRAM according to the first embodiment.

FIG. 2 is a cross sectional view showing the MRAM 100 according to the first embodiment.

The MRAM 100 includes a silicon substrate 101. A transistor 115 is provided on the silicon substrate 101. A first wiring layer 120 is provided on the transistor 115. The first wiring layer 120 includes an interlayer insulating layer 121 made of silicon oxide. Openings are formed in the interlayer insulating layer 121 and a barrier metal layer 122 made of TiN/Ti and a contact plug 123 made of tungsten are embedded therein.

A second wiring layer 130 is provided on the first wiring layer 120 via an interlayer insulating film 125 made of silicon nitride. The second wiring layer 130 includes an interlayer insulating layer 131 made of silicon oxide. Openings are formed in the interlayer insulating layer 131 and a barrier metal layer 132 made of TaN/Ta and a contact plug 133 made of copper are embedded therein.

A third wiring layer 140 is provided on the second wiring layer 130 via an interlayer insulating film 135. Furthermore, a fourth wiring layer 150 is provided on the third wiring layer 140 via an interlayer insulating film 145. The third wiring layer 140 and the fourth wiring layer 150 include interlayer insulating layers 141 and 151, respectively, and contact plugs 143 and 153 are embedded in the interlayer insulating layers 141 and 151 via barrier metal layers 142 and 152, respectively. In addition, a digit line (DL) 154 made of, for example, copper, is formed in the fourth wiring layer 150.

An MRAM memory cell 160 is provided on the fourth wiring layer 150 via an interlayer insulating film 155. A bit line (BL) 170 made of, for example, copper, is provided on the memory cell 160.

Next, the memory cell 160 included in the MRAM 100 is described in detail in reference to FIG. 3. FIG. 3 is a cross sectional view showing a memory cell 160 included in the MRAM 100, and in FIG. 3, symbols which are the same as in FIG. 2 indicate portions which are the same or corresponding.

The memory cell 160 includes the first interlayer insulating layer 11 made of, for example, silicon oxide. In the first interlayer insulating layer 11, the opening 15 is provided and a wiring layer (plug) 23 is embedded therein via a first metal layer (barrier metal layer) 21. The first metal layer 21 is made of, for example, tantalum, and the wiring layer 23 is made of copper. A second metal layer 22 made of, for example, tantalum, is provided so as to cover the first metal layer 21 and the wiring layer 23. A lower electrode (lead-out line) 20 is formed of the first metal layer 21 and the second metal layer 22.

The TMR (tunneling magneto-resistance) element 50 is provided on the lower electrode 20. The TMR element 50 is formed of a lower magnetic film (pin layer) 51, an upper magnetic film (free layer) 53, and a tunnel insulating film 52 that is sandwiched therebetween. The lower magnetic film 51 and the upper magnetic film 53 which form the TMR element 50 are made of a ferromagnetic film, such as a permalloy based metal. In addition, the tunnel insulating film 52 is made of, for example, alumina or MgO, and the film thickness is approximately 10 nm. An upper electrode 60 made of, for example, tantalum, is provided on the upper magnetic film 53.

Furthermore, an interlayer insulating layer 13 made of, for example, silicon nitride, and a second interlayer insulating layer 12 made of silicon oxide are provided so as to cover the lower electrode 20 and the TMR element 50. The barrier metal 171 and the metal layer 32 provided on the second interlayer insulating layer 12 are a part of the bit line (BL) 171. The barrier metal 171 is made of, for example, TaN/Ta, and the metal layer 32 is made of copper.

Next, the manufacturing method of an MRAM 100 according to the present embodiment is described in reference to FIGS. 4A to 5L. In FIGS. 4A to 5L, symbols which are the same as in FIG. 3 indicate portions which are the same or corresponding.

In accordance with the manufacturing method for an MRAM 100, first, the transistor 115 is formed on the silicon substrate 101, and after that the first wiring layer 120, the second wiring layer 130, the third wiring layer 140 and the fourth wiring layer 150 are formed in this order. The wiring layers up to the fourth wiring layer 150 are fabricated in accordance with a conventional manufacturing method.

Next, the memory cell 160 is fabricated on the fourth wiring layer 150. The process for fabricating the memory cell 160 includes the following steps 1 to 12.

Figure 4A:
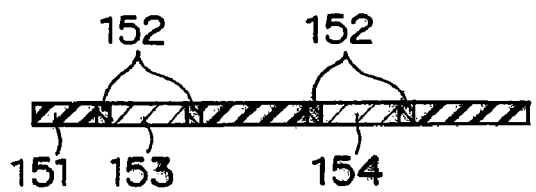
FIGS. 4A to 4G and FIGS. 5H to 5L are cross sectional views illustrating the manufacturing steps of the MRAM according to the first embodiment.

Step 1: FIG. 4A is a cross sectional view showing the upper portion of the fourth wiring layer 150. The contact plug 153 is embedded in the interlayer insulating layer 151 via the barrier metal layer 152. In addition, the digit line (DL) 154 is formed in the interlayer insulating layer 151 via the barrier metal layer 152.

Figure 4B:
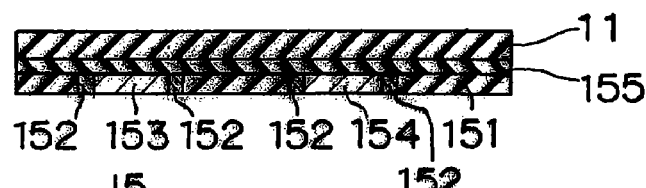

Step 2: As shown in FIG. 4B, the interlayer insulating film 155 made of silicon nitride and the first interlayer insulating layer 11 made of silicon oxide are formed on the interlayer insulating layer 151 in this order in accordance with a CVD method or the like.

Figure 4C:
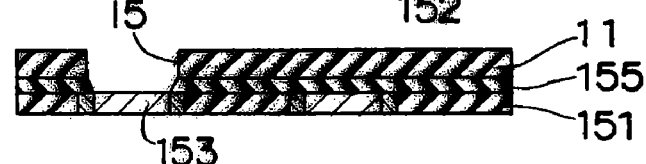

Step 3: As shown in FIG. 4C the first interlayer insulating layer 11 and the interlayer insulating film 155 are etched in accordance with a photolithographic method to form the opening 15. The contact Plug 153 is exposed from the bottom of the opening 15.

Figure 4D:
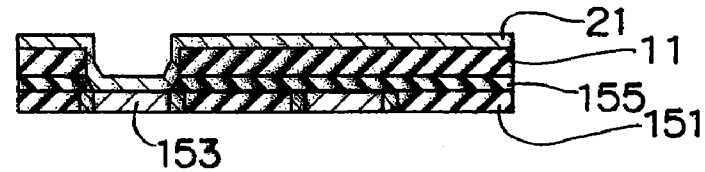

Step 4: As shown in FIG. 4D, the first metal layer (barrier metal layer) 21 is formed. The first metal layer (barrier metal layer) 21 is formed in accordance with, for example, a CVD method. The first metal layer 21 has a multilayer structure that includes Ta and TaN or Ta/TaN, and has high resistance against CMP, which is mainly based on a chemical reaction in which the surface of the metal to be polished is oxidized so that it becomes physically weak and then rubbed off with an abrasive cloth and abrasive grains, for example in the same manner as CMP for copper. In addition, the first metal layer 21 functions as a conductive barrier metal for suppressing diffusion from the wiring layer 23.

Figure 4E:
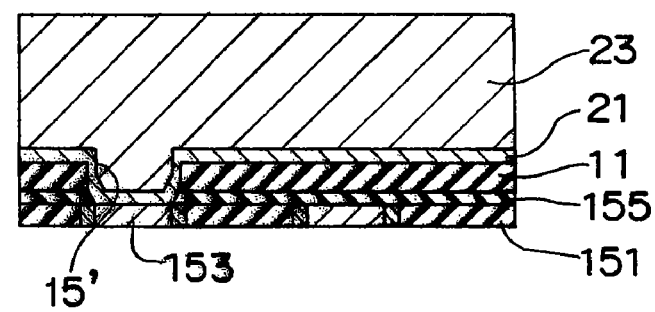

Step 5: As shown in FIG. 4E, the wiring layer (plug) 23 made of, for example, copper, is formed on the first metal layer 21 for embedding the opening 15' formed in the first metal layer 21. The wiring layer 23 is formed in accordance with, for example, a plating method. W, Ru, Pt, Al, Si (polycrystal Si), Ti, TiN, Ni, Fe, Cr or an alloy thereof, which can be removed through CMP mainly based on a chemical reaction, may be used other than copper as the material for the wiring layer 23.

Figure 4F:
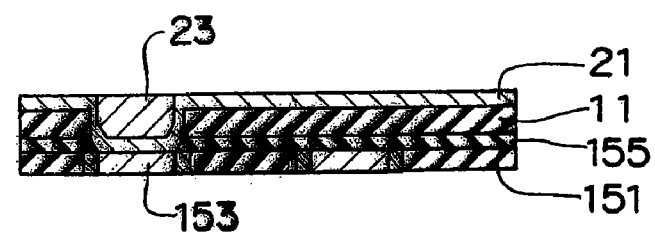

Step 6: As shown in FIG. 4F, the film thickness of the wiring layer 23 is reduced in accordance with a CMP method so that the wiring layer 23 remains only in the opening 15' formed in the first metal layer 21. In this CMP process, the first metal layer 21 is used as a stopper layer.

Concretely, in the case where copper is used as the material for the wiring layer 23 and Ta/TaN is used for the first metal layer (barrier metal layer) 21 (Cu-CMP), PL-7105, manufactured by Fujimi Incorporated, for example, is used as the slurry, in order to make the selection ratio between the materials increase, and polishing is carried out until Ta is exposed under such conditions that the number of rotations is 100 rpm and the pressing pressure is 20 kPa. At this time, the selection ratio of copper to Ta/TaN is high, and therefore, polishing is carried out for slightly longer (over-etching), in order to prevent copper residue from remaining. The pressing pressure for polishing may, of course, be lowered to 10 kPa, in order to reduce the depth of the recess in the upper portion of the copper wiring layer 23 which the opening is embedded therein.

Figure 4G:
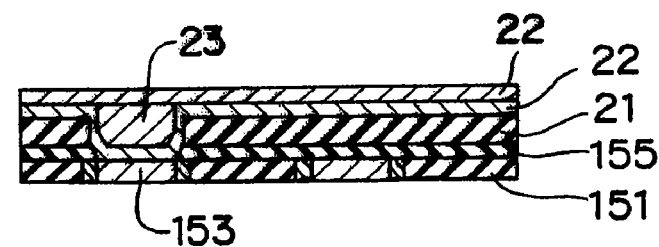

Step 7: As shown in FIG. 4G, a second metal layer 22 is formed in accordance with a CVD method or the like so as to cover the entire surface. Ta and TaN, NiFeCr, which affects the magnetic properties little, and further conductive materials, such as Cu, W, Si, Ru, Pt, Al, Ti, TiN, Fe and Cr, can be used for the second metal layer 22.

Here, though in some cases a metal oxide film is formed due to the oxidation of the surface of the first metal layer 21 in the CMP process (step 6), it is preferable that there is no metal oxide film, in order to reduce the wire resistance.

Figure 5H:
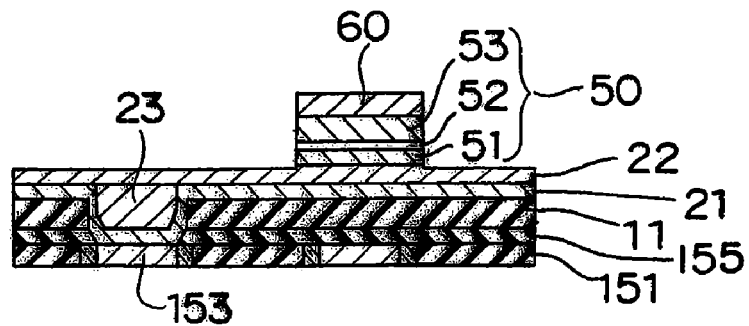

Step 8: As shown in FIG. 5H, a ferromagnetic film, such as of a permalloy based metal, an insulating film made of alumina or MgO, a ferromagnetic film and an upper electrode layer which includes tantalum are laminated on the second metal layer 22 in this order and patterned in accordance with a photolithographic technology and an etching technology so that the TMR element 50 formed of the lower magnetic film (pin layer) 51, the upper magnetic film (free layer) 53 and the tunnel insulating film 52 that is sandwiched therebetween, and an upper electrode 60 is formed thereon.

Figure 5I:
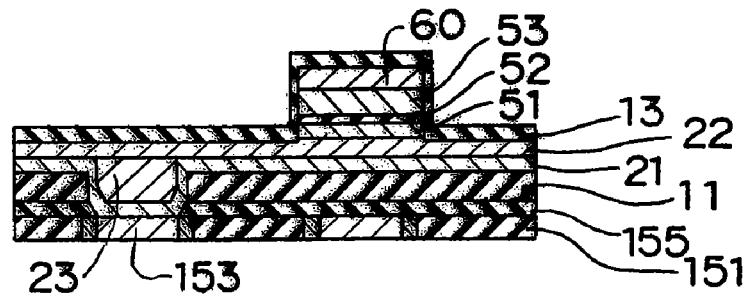

Step 9: As shown in FIG. 5I, a silicon nitride layer is formed in accordance with, for example, a CVD method, so as to cover the entire surface.

Figure 5J:
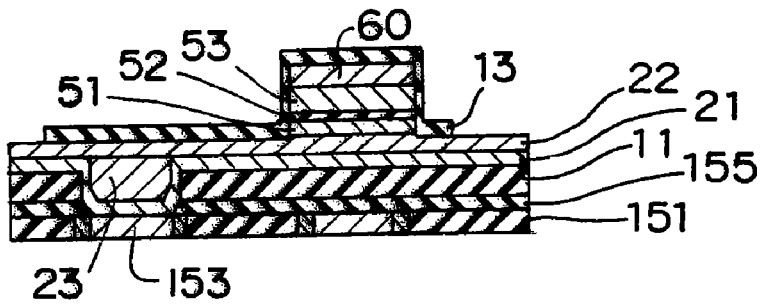

Step 10: As shown in FIG. 5J, the silicon nitride layer is selectively etched in accordance with a photolithographic technology so that an interlayer insulating layer 13 is formed.

Figure 5K:
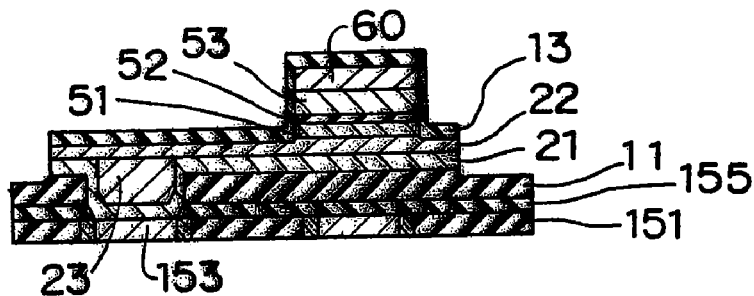

Step 11: As shown in FIG. 5K, the interlayer insulating layer 13 is used as an etching mask and the second metal layer 22, the first metal layer 21 and the first interlayer insulating layer 11 are etched. Though etching can be stopped on the upper surface of the first interlayer insulating layer 11, it is conducted to stop in the middle of the first interlayer insulating layer 11, in order to completely remove any etching residue of the first metal layer 21. Here, the interlayer insulating film 13 can be etched the first metal layer 21 and the second metal layer 22 in such a state that it covers the sides of the TMR element 50, and therefore, it can prevent the properties of the TMR element 50 from deteriorating due to organic contamination of etching residue, resist and the like on the sides of the TMR element 50.

Figure 5L:
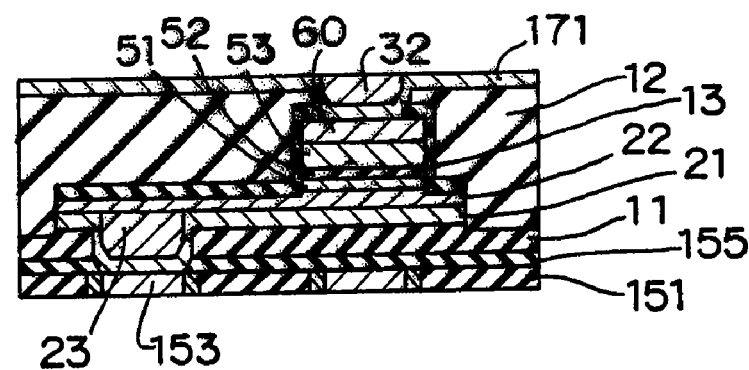

Step 12: As shown in FIG. 5L, the second interlayer insulating layer 12 made of silicon oxide is formed. The memory cell 160 is complete after the above described steps.

Finally, the second interlayer insulating layer 12 and the interlayer insulating layer 13 on the upper electrode 60 are etched to form the opening, and the barrier metal 171 made of TaN/T, for example, and the metal layer 32 (bit line) made of copper are formed in accordance with a plating method, and thus, an MRAM 100 is completed.

Figure 6:
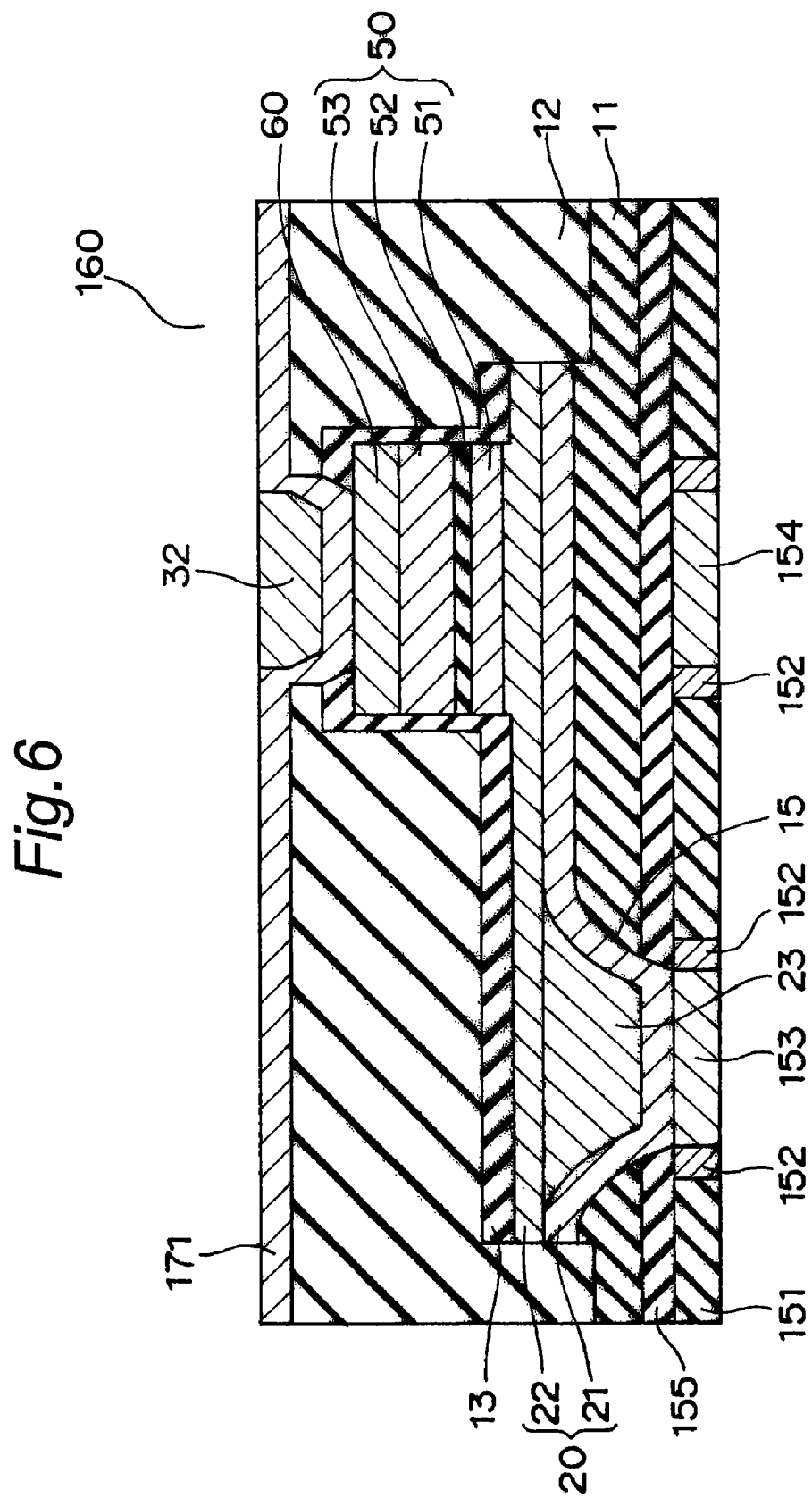
FIG. 6 is a cross sectional view showing another memory cell according to the first embodiment.

Here, in Step 3 (FIG. 4C), in some cases the side walls of the opening 15 may become diagonal instead of vertical, depending on the conditions for etching to form the opening 15. FIG. 6 is a cross sectional view showing the memory cell 160 in the case where the side walls of the opening 15 are diagonal, and in FIG. 6, symbols which are the same as in FIG. 3 indicate portions which are the same or corresponding.

The memory cell 160 having the structure in FIG. 6 may be used in the MRAM 100 according to the first embodiment. The memory cell 160 in FIG. 6 has a structure in which the side wall portions become a taper form as a result of the etching process for the opening 15, and t the wiring layer 23 is embedded therein. As a result, it becomes possible that the peripheral portion on the upper surface of the wiring layer 23 is formed so as to have a higher flatness, and furthermore, the flatness in the vicinity of the wiring layer 23 of the first metal layer 21 can be increased.

Figure 11:
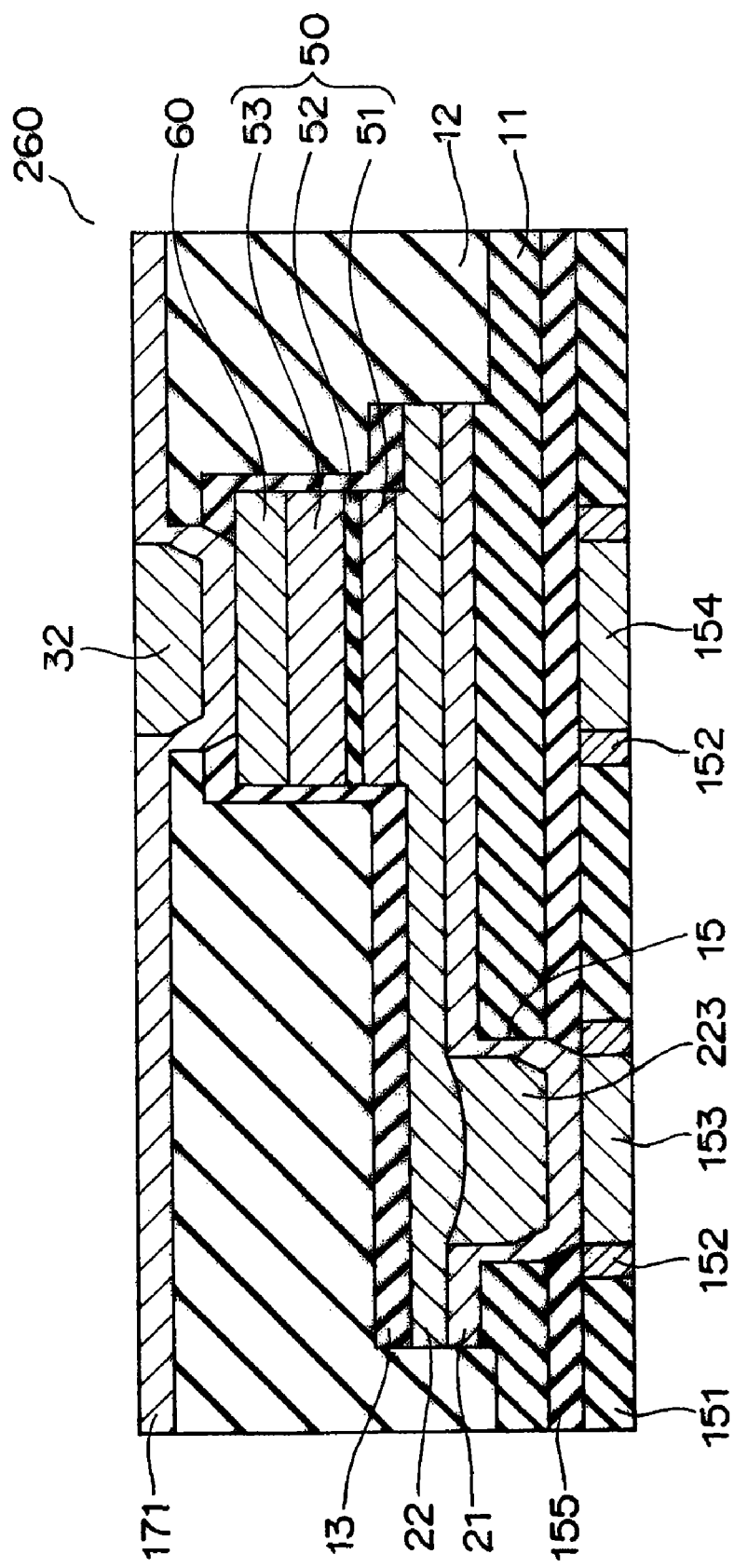
FIG. 11 is a cross sectional view showing another memory cell according to the first embodiment.

This structure, where the side walls of the opening 15 are in taper form, can be applied to other memory cells 260 according to the first embodiment shown in FIG. 11, and memory cells 360 and 460 according to the second embodiment.

Next, the characteristics of the MRAM 100 according to the present embodiment are described.

Figure 7A:
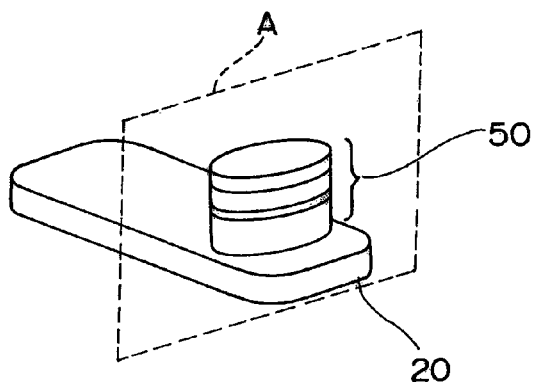
FIGS. 7A to 7C are schematic views showing a TMR element.
Figure 7B:
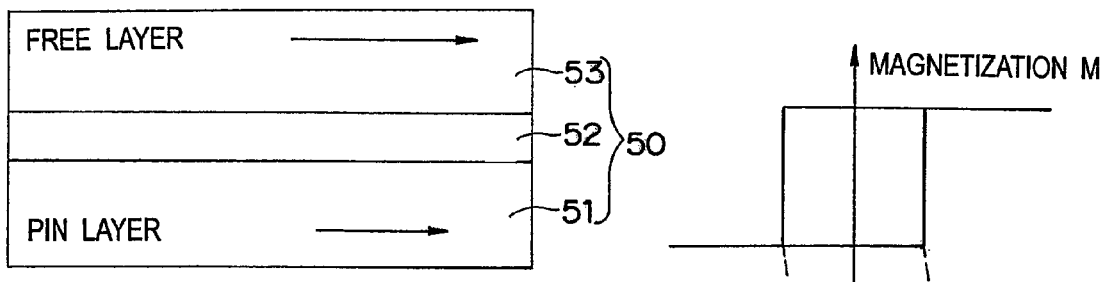
Figure 7C:
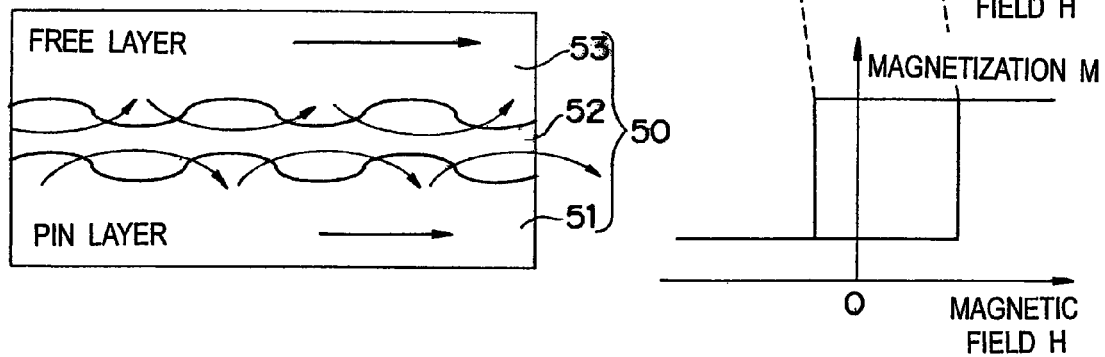

First, FIG. 7A is a schematic view showing the TMR element 50 which is included in the MRAM according to the first embodiment. In addition, FIG. 7B is a cross sectional view showing the TMR 50 according to the first embodiment, and FIG. 7C is a cross sectional view showing a conventional TMR. FIGS. 7B and 7C correspond to cross sectional views along plane A in FIG. 7A.

As shown in FIG. 7B, a step of embedding the wiring layer 23 in the TMR element 50 according to the first embodiment is carried out in accordance with a CMP method, in which the first metal layer (barrier metal layer) 21 is used as a stopper layer. Therefore, the flatness of the surface of the first metal layer 21 is extremely high (see FIG. 3). Accordingly, the second metal layer 2, the lower magnetic film (pin layer) 51, the tunnel insulating film 52 and the upper magnetic film (free layer) 53 laminated on the first metal layer 21 also become flat films.

In contrast, in the conventional TMR element shown in FIG. 7C, the respective layers composed of the TMR element are formed on the lower layer wire having microscopic unevenness. Therefore, the coarseness on the surface of the lower layer wire directly affects the flatness of the respective layers composed of the TMR element. As a result, as shown in FIG. 7C, the thickness of the tunnel insulating film 52 becomes inconsistent, and thus the surface becomes coarse (b/a), and thus, unnecessary magnetic line of force, referred to as nail coupling (shown by arrows in the figure), are generated.

As a result, as shown in the right-side view in FIG. 7C, the hysteresis of the magnetic line of force, which should be symmetric with the y axis (magnetization axis), shifts in the conventional TMR element.

In the MRAM 100 according to the present embodiment, the tunnel insulating film 52 becomes flat and the thickness becomes approximately constant within the range of inconsistency in the flatness of the base as described above, and therefore, no unnecessary magnetic line of force is generated, and thus, the hysteresis of the magnetic line of force becomes symmetric with the y axis (magnetization axis).

Figure 8:
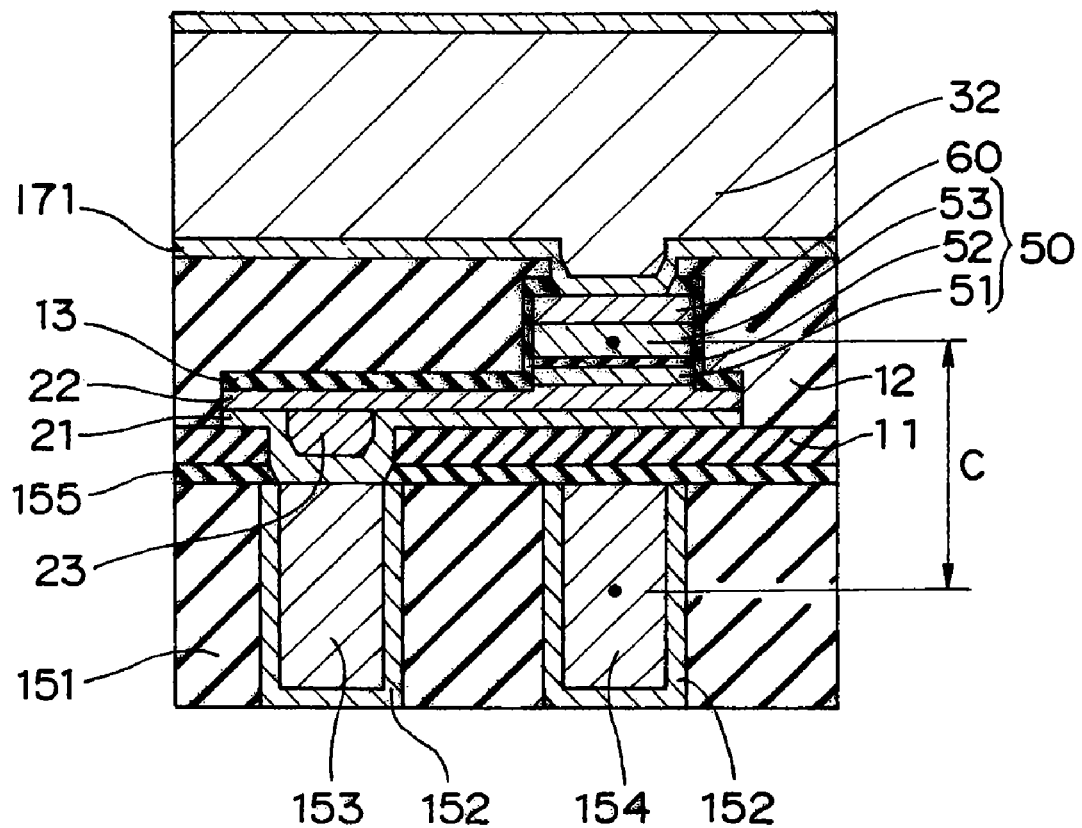
FIG. 8 is a cross sectional view showing a portion of the MRAM according to the present embodiment.

Second, FIG. 8 is a cross sectional view showing a portion of the MRAM 100 according to the present embodiment. In the MRAM, the distance between the center of the digit line (DL) 154 (intersection of diagonal lines in the cross sectional view of FIG. 8) and the center of the upper magnetic film (free layer) 53 affects the magnitude of the current for writing into the TMR element (current required for writing information).

In the TMR element according to the present embodiment, as described above, the first metal layer 21 functions as a stopper layer in the CMP process, and the film thickness of the first interlayer insulating layer 11 is not reduced. Therefore, the distance between the center of the digit line (DL) 154 and the center of the upper magnetic film (free layer) 53 can be controlled with precision using the film thickness of the first metal layer 21 and the like formed therebetween, and thus, there is almost no inconsistency between a plurality of TMR elements included in the MRAM 100. Accordingly, the current for writing in into the TMR elements included in the MRAM 100 can have an approximately constant value.

Figure 9A:
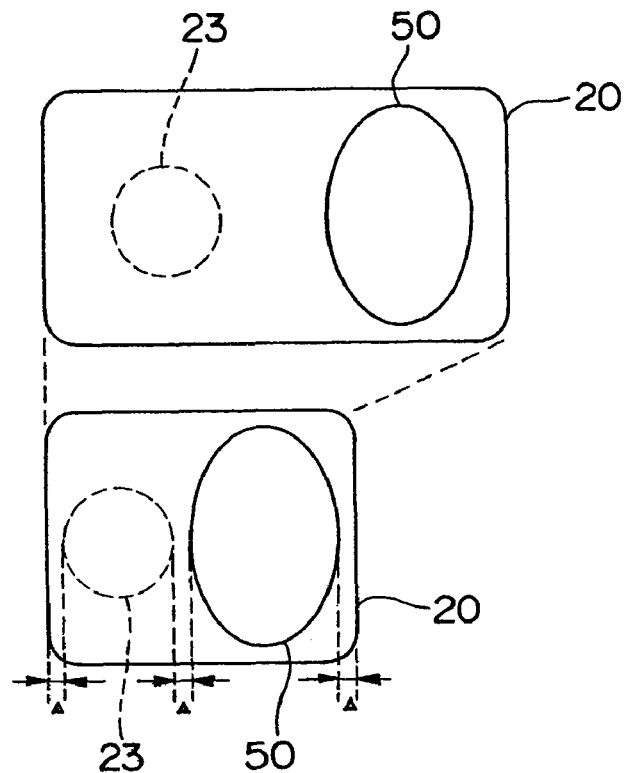
FIGS. 9A and 9B are schematic views showing a memory cell as viewed from the top.
Figure 9B:
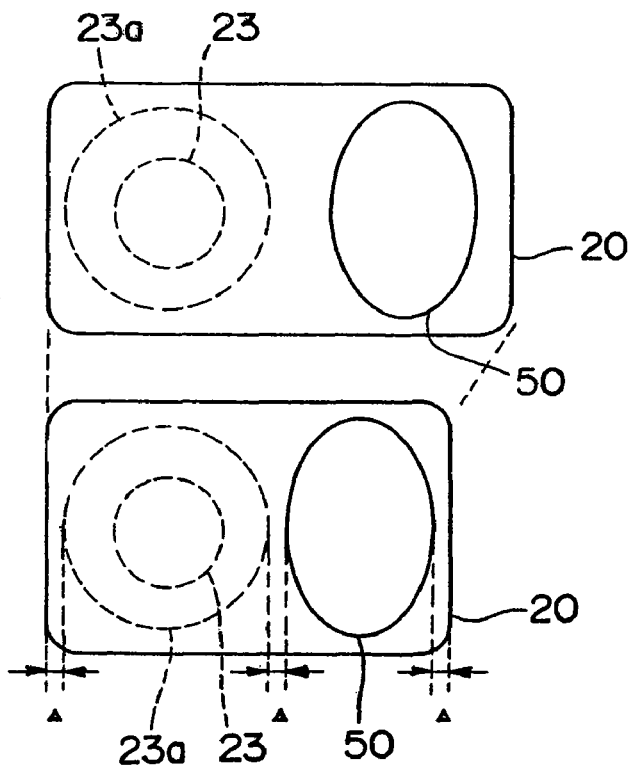

Third, FIGS. 9A and 9B are schematic views showing a memory cell as viewed from the top. FIG. 9A shows the memory cell according to the present embodiment, and FIG. 9B shows a conventional memory cell. In the memory cells, a TMR element 50 is provided on the lower layer wire 20. The lower portion of the lower layer wire 20 is connected to a wiring layer 23.

As described above, in the memory cell according to the present embodiment shown in FIG. 9A, the upper surface of the wiring layer 23 embedded in the first metal layer 21 is in approximately the same plane as the surface of the first metal layer 21 and is high flatness. Therefore, in the case where an alignment margin in the manufacturing process is A, at least one of the distance between the wiring layer 23 and the TMR element 50 and the distance between the wiring layer 23 and the end portion of the lower layer wire 20 may be A, and thus, miniaturization of the memory cell becomes possible, as shown in the lower view in FIG. 9A.

In contrast, in the conventional memory cell, the upper surface of the first metal layer 21 is also polished in the step of forming the wiring layer 23 in accordance with a CMP process, and therefore, a region 23a having uneven or rough is formed on the surface of the first metal layer 21 around the wiring layer 23. Therefore, it is necessary that at least one of the distance between the region 23a and the TMR element 50 and the distance between the region 23a and the end portion of the lower layer wire 20 should be Δ, in order to prevent the above described nail coupling phenomenon from generating when the TMR element 50 is formed on the region 23a, and thus, miniaturization of the memory cell is difficult, as shown in the lower view in FIG. 9B.

Figure 10A:
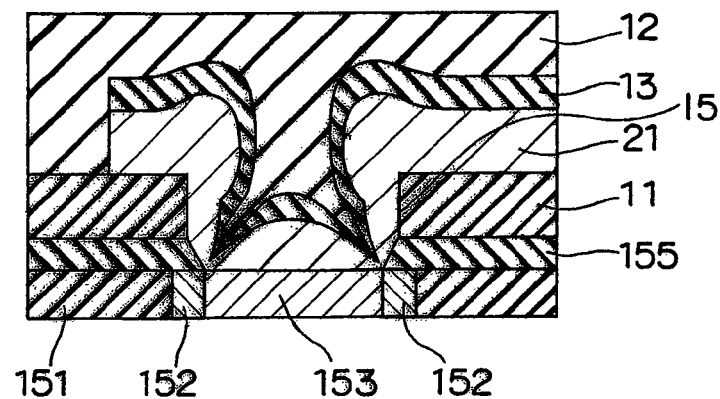
FIGS. 10A to 10C are cross sectional views showing the vicinity of a wiring layer in a conventional MRAM.
Figure 10B:
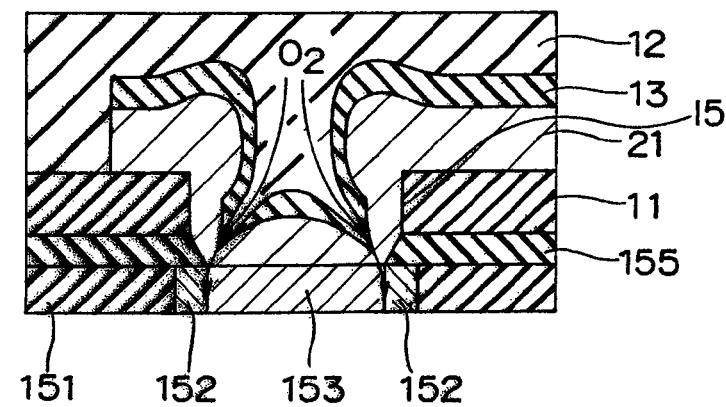
Figure 10C:
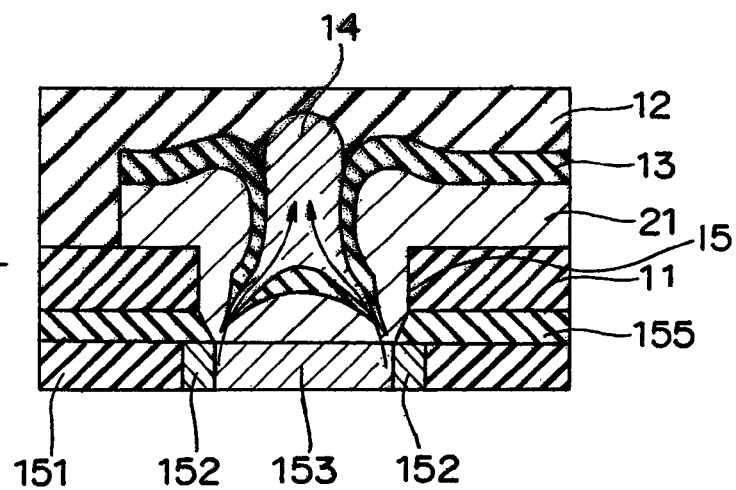

Fourth, FIGS. 10A to 10C are cross sectional views showing the vicinity of the wiring layer 23 in the conventional MRAM. In accordance with the conventional manufacturing processes, the first metal layer (barrier metal layer) 21 was formed in accordance with a sputtering method after the formation of the first interlayer insulating layer 11 and the opening 15 in the interlayer insulating film 155. Therefore, as shown in FIG. 10A, a region where the first metal layer 21 was thin (weak point) was formed in the corner portions of the bottom of the opening 15.

As a result, as shown in FIG. 10B, oxygen diffused into the contact plug 153 through the weak point from the second interlayer insulating layer 12, which was made of, for example, silicon oxide, and thus, the contact plug 153, which was made of, for example, copper, was oxidized. The volume of the oxidized contact plug 153 increased, and as shown in FIG. 10C, a metal oxide layer 14, which was made of such as copper oxide was formed within the opening 15, and thus, the electrical resistance increased and the reliability lowered.

In contrast, the first metal layer 21 in the MRAM 100 according to the present embodiment is formed in accordance with a CVD method, and therefore, the film thickness of the first metal layer (barrier metal layer) 21 within the opening 15 becomes approximately uniform, and no weak points are formed. Therefore, no metal oxide layer 14 is formed, and increase of the electrical resistance and deterioration of the reliability can be prevented.

Next, other memory cell structures used in the MRAM 100 are described. FIG. 11 is a cross sectional view showing the memory cell 260, and in FIG. 11, symbols which are the same as in FIG. 3 indicate portions which are the same or corresponding.

In the memory cell 260, the wiring layer 223 embedded in the opening 15 is formed of tungsten. Therefore, the wiring layer 223 is dished in the CMP process for forming the wiring layer 223, and thus a recess form having a dented center. Meanwhile, the surface of the second metal layer 22 on the wiring layer 223 is flat. Other structures are similar to the memory cell 160 shown in FIG. 3. Here, the wiring layer 223 with a dented center may be formed of copper.

FIGS. 12A to 13I are cross sectional views illustrating a manufacturing method for an MRAM which includes the memory cell 260. In FIGS. 12A to 13I, symbols which are the same as in FIG. 4 indicate portions which are the same or corresponding.

In accordance with the manufacturing method for the MRAM 100, first, the transistor 115 is formed on the silicon substrate 101 in the same manner as in the above described manufacturing method, and after that, the first wiring layer 120, the second wiring layer 130, the third wiring layer 140 and the fourth wiring layer 150 are formed in this order. The layers up to the fourth wiring layer 150 are fabricated in accordance with a conventional manufacturing method.

Next, the memory cell 260 is fabricated on the fourth wiring layer 150. The process for fabricating the memory cell 260 includes the following steps 1 to 12.

Figure 12A:
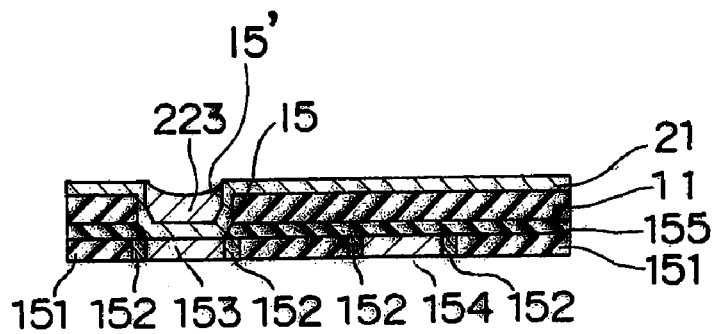
FIGS. 12A to 12E and FIGS. 13F to 13I are cross sectional views illustrating the manufacturing steps of another MRAM according to the first embodiment.

Step 1: As shown in FIG. 12A, in the opening 15' formed in the first metal layer 21 in accordance with a CVD method or the like, the wiring layer 223 made of, for example, tungsten, is embedded in accordance with the above described manufacturing steps 1 to 6. The first metal layer (barrier metal layer) 21 is formed in accordance with a CVD method, and the wiring layer 223 is formed in accordance with a sputtering method or a CVD method. In addition, the wiring layer 223 on the first metal layer 21 is removed in accordance with a CMP method, in which the first metal layer 21 is used as a stopper layer. Tungsten is easy to polish through a CMP process in comparison with copper, and therefore, as shown in FIG. 12A, the surface of the wiring layer 223 has a form of a dent in the vicinity of the center in comparison with in the case where the wiring layer 223 is formed of copper.

The distance between the surface of the first metal layer (barrier metal layer) 21 and the bottom of the wiring layer 223 having a recessed structure in the direction of the normal line of the first metal layer 21 is preferably 30% or less, more preferably 10% or less of the film thickness of the tunnel insulating film 52 included in the TMR element 50. The film thickness of the tunnel insulating film 52 is preferably approximately 10 nm, and therefore, the distance becomes approximately 1 nm.

In the case where tungsten is used as the material for the wiring layer 223 (W-CMP) and Ta/TaN is used for the first metal layer (barrier metal layer) 21, a standard slurry, such as SS-W2000, manufactured by Cabot Corporation, is used, in order to increase the selection ratio between the materials, and the wiring layer 223 is polished until the Ta/TaN is exposed under such conditions that the number of rotations is 100 rpm and the pressing pressure is 30 kPa. At this time, polishing is carried out for slightly longer, in order to prevent tungsten residue from remaining, with a low pressing pressure, in order to reduce the depth of the recess in the upper portion of the wiring layer 23.

Figure 12B:
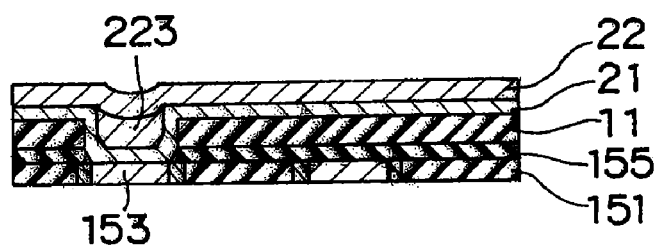

Step 2: As shown in FIG. 12B, a second metal layer 22 is formed so as to cover the entire surface. Ta and TaN, NiFeCr, which affects the magnetic properties little, and further conductive materials, such as Cu, W, Si, Ru, Pt, Al, Ti, TiN, Fe and Cr, can be used for the second metal layer 22. A recess corresponding to the recess in the wiring layer 223 is formed on the upper surface of the second metal layer 22.

Figure 12C:
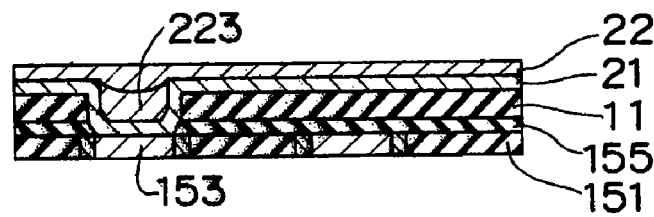

Step 3: As shown in FIG. 12C, the surface of the second metal layer 22 is flattened through a CMP process. In the CMP process, the number of rotations is set higher than in conventional polishing, and the pressing pressure is set lower. In the case where the second metal layer 22 is made of Ta, for example, CMP is usually carried out under such conditions that the number of rotations is 100 rpm and the pressure is 20 kPa, however in this case, the CMP is carried out under such conditions that the number of rotations is 150 rpm to 200 rpm and the pressure is 5 kPa to 10 kPa.

In addition, a polishing cloth having a higher hardness may be used in the CMP for the second metal layer 22. Furthermore, it is preferable that the abrasive grains used is colloidal silica based abrasive grains rather than fumed silica based abrasive grains, because the coarseness on the surface is important in many cases.

Recently, in many cases EPD can be switched for each step during polishing, and therefore, a CMP process is carried out under general conditions until the depression becomes small to some degree, and polishing may be subsequently carried out with high-speed rotation and low pressure, as under the above described conditions, in the case where it is desired not to be the throughput lower.

As shown in FIG. 12C, the surface of the second metal layer 22 can be flattened by carrying out the CMP process.

Figure 12D:
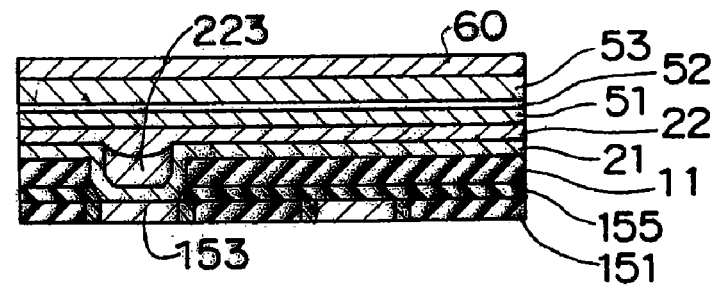
Figure 12E:
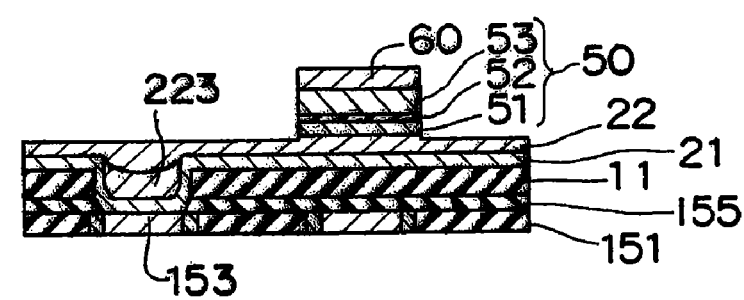
Figure 13F:
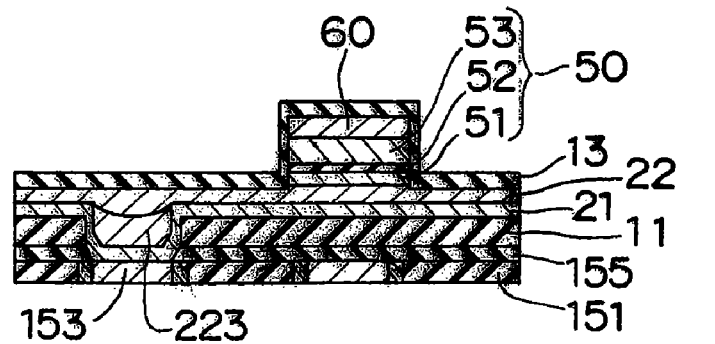
Figure 13G:
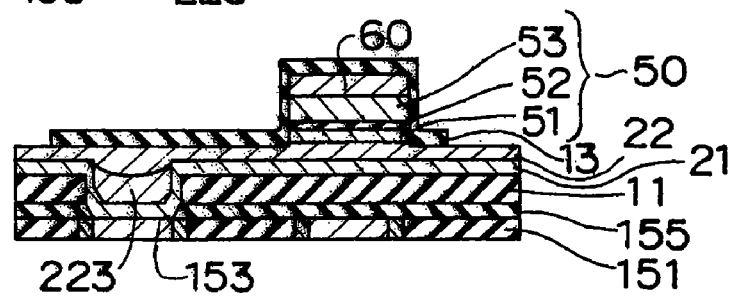
Figure 13H:
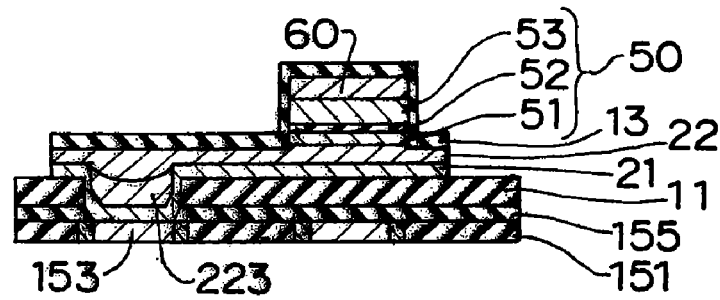
Figure 13I:
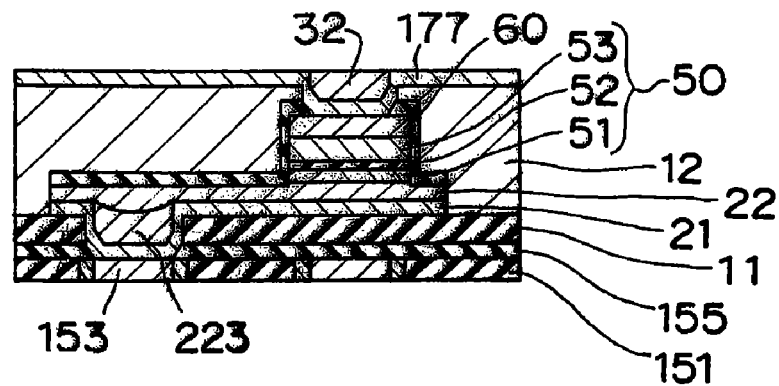

Steps 4 to 8: As shown in FIG. 12D, a ferromagnetic film made of a permalloy based metal, an insulating film made of alumina or MgO, a ferromagnetic film and an upper electrode layer are laminated on the second metal layer 22 in this order, and after that, the same steps as in the above FIGS. 5H to 5L (FIGS. 12D to 13I) are carried out, so that the memory cell 260 shown in FIG. 13I is obtained.

Finally, the second interlayer insulating layer 12 and the interlayer insulating layer 13 on the upper electrode 60 are etched to form an opening, and the a barrier metal 171 made of, for example, TaN/T, and the metal layer 32 made of copper (bit line) are formed, and thus the MRAM 100 is completed.

The MRAM including a memory cell 260 can have the same characteristics and effects as above described MRAM including a memory cell 160.

Second Embodiment

Figure 14:
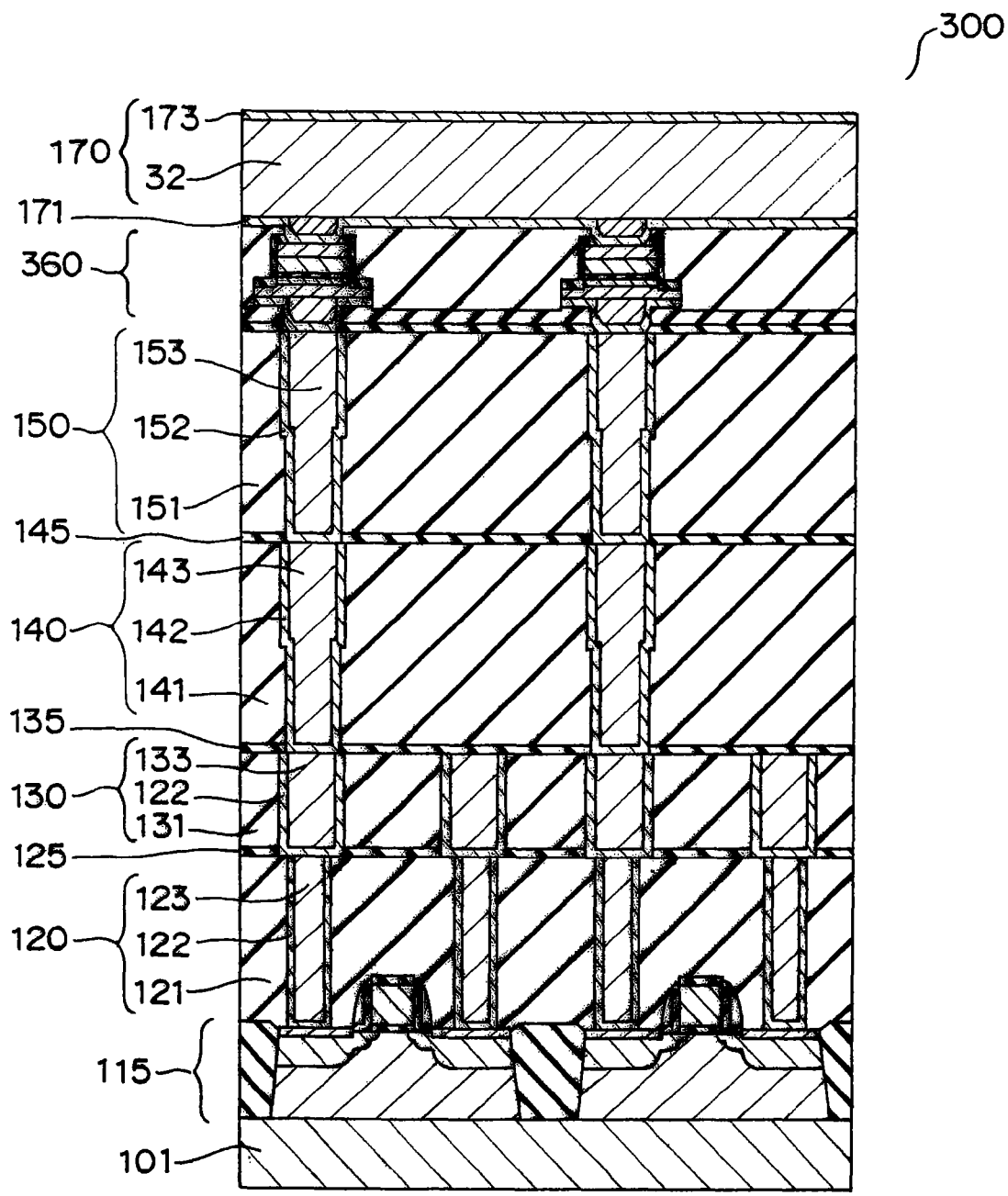
FIG. 14 is a cross sectional view showing an STT-RAM according to the second embodiment.

FIG. 14 is a cross sectional view showing a magnetic memory device according to the second embodiment, denoted by 300 as a whole, and concretely, a cross sectional view showing an STT-RAM (spin torque transfer-RAM). In FIG. 14, symbols which are the same as in FIG. 2 indicate portions which are the same or corresponding.

The STT-RAM 300 has the same structure as the MRAM 100, except that there are no digit lines (DL) and the TMR element 50 is provided above the contact plug 153.

Here, although the TMR element 50 is provided directly above the contact plug 153 in the STT-RAM 300 in FIG. 14, the TMR element 50 may be provided in a location at a distance from the contact plug 153, as in the MRAM 100 in FIG. 2.

Figure 15:
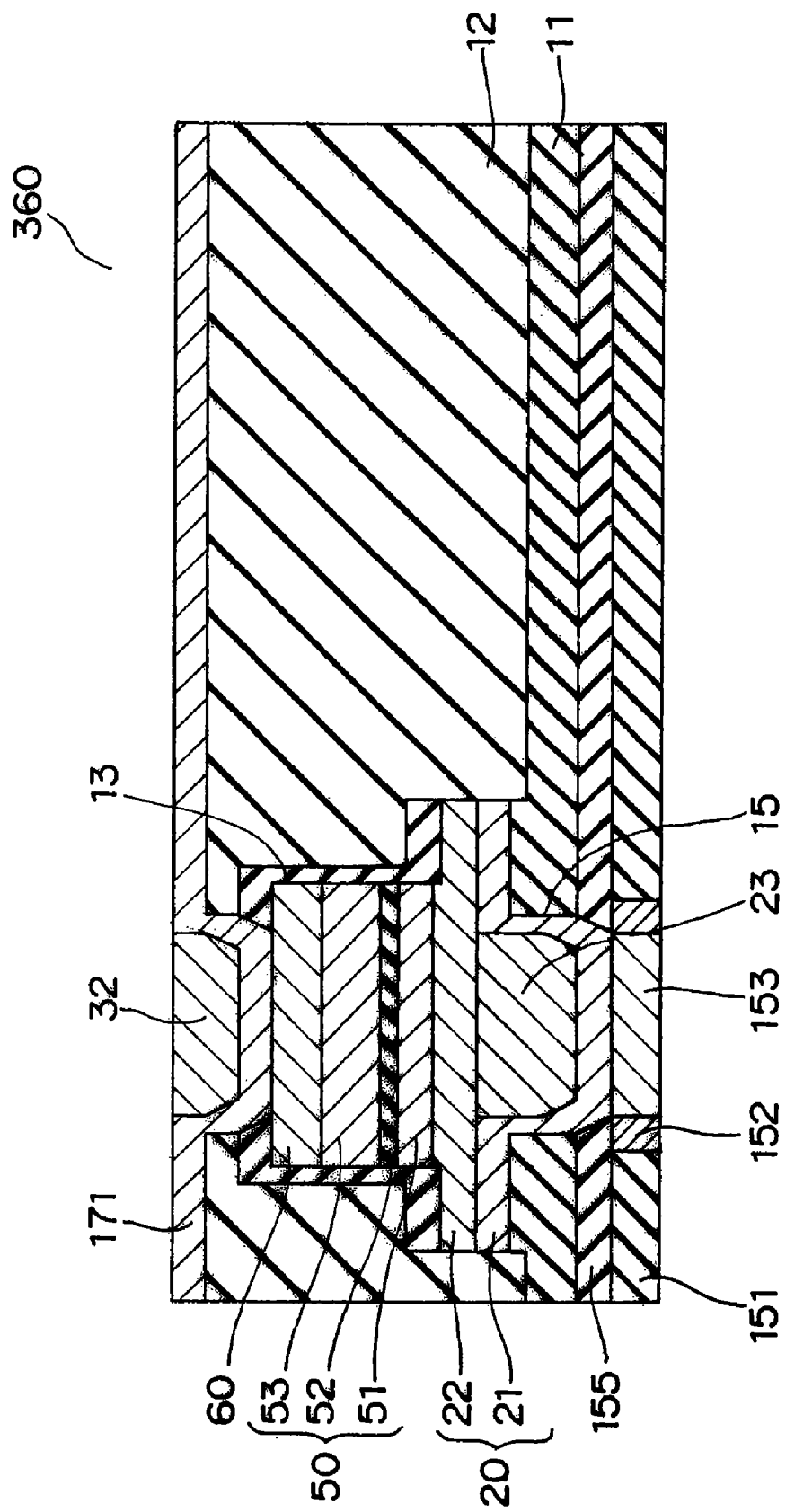
FIG. 15 is a cross sectional view showing a memory cell according to the second embodiment.

FIG. 15 is a cross sectional view showing a memory cell 360 of the STT-RAM 300, and symbols which are the same as in FIG. 3 indicate portions which are the same or corresponding. In the STT-RAM 300, the first metal layer 21 is formed in the opening 15 in accordance with a CVD method, and after that the wiring layer 23 is embedded in the opening 15, and thus, the wiring layer 23 is formed in accordance with a CMP method, in which the first metal layer 21 is used as a stopper layer. The wiring layer 23 is made of, for example, copper.

In this STT-RAM 300, the surface of the wiring layer 23 is in approximately the same plane as the first metal layer 21. Therefore, the second metal layer 22, the lower magnetic film (pin layer) 51, the tunnel insulating film 52 and the upper magnetic film (free layer) 53 formed thereon also become flat films, and thus, nail coupling can be prevented.

In addition, the TMR element 50 can be formed directly above the contact plug 153, and therefore, miniaturization of the memory cell becomes possible.

Furthermore, the first metal layer (barrier metal layer) 21 is formed in accordance with a CVD method, and therefore, the film thickness of the first metal layer 21 is approximately constant, and thus, weak points as described above can be prevented from being formed.

Figure 16:
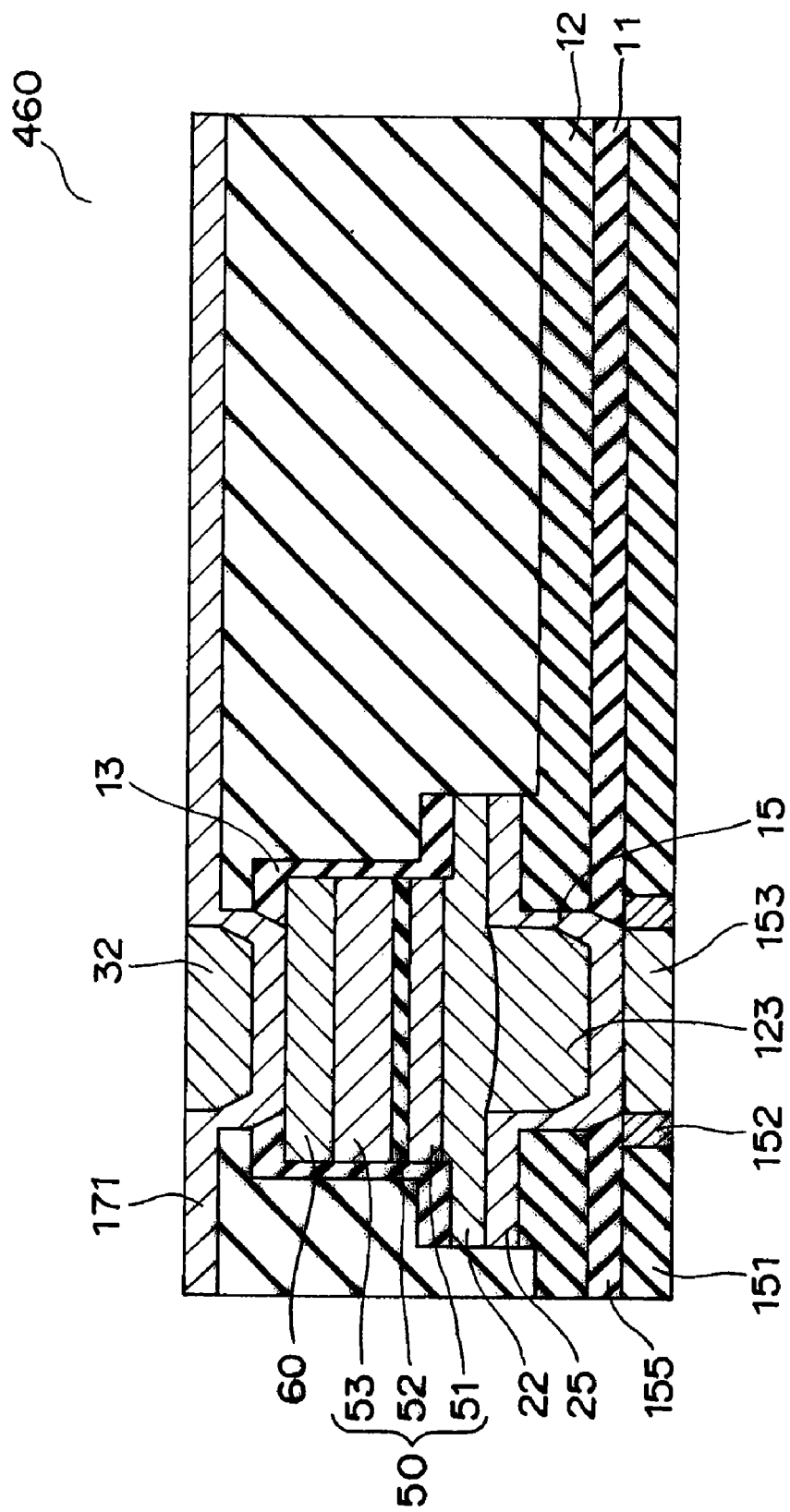
FIG. 16 is a cross sectional view showing another memory cell according to the second embodiment.

FIG. 16 is a cross sectional view showing another memory cell 460 which can be used in the STT-RAM 300. In FIG. 16, symbols which are the same as in FIG. 11 indicated portions which are the same or corresponding.

In the memory cell 460, the wiring layer 223 embedded in the opening 15 is formed of tungsten, and a recess is formed in the center portion. Meanwhile, the surface of the second metal layer 22 on the wiring layer 223 is flat. Other structures are the same as the memory cell 360 shown in FIG. 15.

Here, the memory cell 460 can be fabricated through approximately the same manufacturing process as the memory cell 260 included in the MRAM 100.

What is claimed is:
1. A method for manufacturing a magnetic memory device including a TMR element, comprising:
   a step of forming a lower wiring layer;
   a step of forming an interlayer insulating layer on the lower wiring layer;
   a step of forming an opening in the interlayer insulating layer so that the lower wiring layer is exposed;
   a step of forming a barrier metal layer so that the interlayer insulating layer and an inner surface of the opening are covered;

a step of forming a metal layer on the barrier metal layer so that the opening is embedded;

a polishing step of removing the metal layer on the barrier metal layer through polishing using the barrier metal layer as a stopper so that a wiring layer that comprises the metal layer being embedded in the opening and the barrier metal layer is formed;

a step of forming a second metal layer which covers the wiring layer;

an element fabricating step of fabricating the TMR element on the second metal layer;

a step of forming an insulating layer covering a side surface of the TMR element and an upper surface of the wiring layer, wherein the insulating layer includes a silicon and a nitrogen;

a step of patterning the insulating layer with a photolithographic technology; and a step of etching the second metal layer and the barrier metal layer using the patterned insulating layer as a mask.

2. The method for manufacturing a magnetic memory device according to claim 1, wherein the barrier metal layer is formed in accordance with a CVD method.

3. The method for manufacturing a magnetic memory device according to claim 1, wherein the polishing step is the step of reducing the film thickness of the metal layer in accordance with a CMP method until an upper surface of the metal layer and a surface of the barrier metal layer become approximately the same plane.

4. The method for manufacturing a magnetic memory device according to claim 1, wherein the metal layer is made of copper and the barrier metal layer includes Ta.

5. The method for manufacturing a magnetic memory device according to claim 1,
wherein the step of etching the second metal layer and the barrier metal layer further comprises a step of etching the interlayer insulating layer after etching the barrier metal layer and the etching is stopped within the interlayer insulating layer.

* * * * *